United States Patent
Lunde

(10) Patent No.: US 7,170,091 B2
(45) Date of Patent: Jan. 30, 2007

(54) PROBE LOOK AHEAD: TESTING PARTS NOT CURRENTLY UNDER A PROBEHEAD

(75) Inventor: Aron T Lunde, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/330,810

(22) Filed: Jan. 12, 2006

(65) Prior Publication Data

US 2006/0113535 A1  Jun. 1, 2006

Related U.S. Application Data

(62) Division of application No. 10/654,655, filed on Sep. 3, 2003, which is a division of application No. 10/178,111, filed on Jun. 24, 2002, now Pat. No. 6,630,685.

(51) Int. Cl.
*H01L 23/58* (2006.01)
(52) U.S. Cl. .......................... 257/48; 257/723
(58) Field of Classification Search ............... 257/48, 257/723, 724, 777, 686, 691
See application file for complete search history.

(56) References Cited

U.S. PATENT DOCUMENTS

| | | | |
|---|---|---|---|
| 4,479,088 A | 10/1984 | Stopper | |
| 5,214,657 A | 5/1993 | Farnworth et al. | |
| 5,252,507 A | 10/1993 | Hively et al. | |
| 5,483,175 A | 1/1996 | Ahmad et al. | |
| 5,815,427 A | 9/1998 | Cloud et al. | |
| 5,831,445 A | 11/1998 | Atkins et al. | |
| 5,862,147 A | 1/1999 | Terauchi | |
| 6,003,149 A | 12/1999 | Nevill et al. | |
| 6,055,199 A | 4/2000 | Hamade et al. | |
| 6,104,651 A | 8/2000 | Cowles et al. | |
| 6,105,152 A | 8/2000 | Duesman et al. | |
| 6,154,864 A | 11/2000 | Merritt | |
| 6,233,184 B1 | 5/2001 | Barth et al. | |
| 6,233,185 B1 | 5/2001 | Beffa et al. | |
| 6,243,840 B1 | 6/2001 | Raad et al. | |
| 6,246,245 B1 | 6/2001 | Akram et al. | |
| 6,272,588 B1 | 8/2001 | Johnston et al. | |
| 6,275,058 B1 | 8/2001 | Lunde et al. | |
| 6,292,009 B1 | 9/2001 | Farnworth et al. | |

(Continued)

*Primary Examiner*—S. V. Clark
(74) *Attorney, Agent, or Firm*—Whyte Hirschboeck Dudek SC

(57) ABSTRACT

A semiconductor substrate, probe card, and methods for stressing and testing dies on a semiconductor substrate are provided. The semiconductor substrate, typically a semiconductor wafer, comprises dies disposed thereon and a redistribution layer (RDL) for routing signals from a test circuit into dies on the substrate that are not currently under probe. The RDL includes look-ahead contacts associated with a first die set that are electrically connected by traces to dies of a second die set. Upon contact of elements of the probe tester with the look-ahead contacts, required Vcc power, GND ground potential and signals from the probe tester are routed through the traces to the die of the die set not currently under probe. The dies can comprise a built-in self-stress (BISS) circuit and/or a built-in self-test (BIST) circuit for implementing a stress or test sequence. The look-ahead contacts allow for overlapping or substantially simultaneously stressing and/or testing dies of dies of a die set currently under probe and dies of a second die set located prior to or after the current probe head position (i.e., not under probe).

16 Claims, 9 Drawing Sheets

U.S. PATENT DOCUMENTS

| | | |
|---|---|---|
| 6,300,786 B1 | 10/2001 | Doherty et al. |
| 6,323,639 B1 | 11/2001 | Park |
| 6,327,199 B1 | 12/2001 | Fister |
| 6,427,222 B1 | 7/2002 | Shau |
| 6,534,785 B1 | 3/2003 | Farnworth et al. |
| 6,548,826 B2 | 4/2003 | Fenner et al. |
| 6,594,186 B2 | 7/2003 | Kodaira et al. |
| 6,701,474 B2 | 3/2004 | Cooke et al. |
| 6,967,348 B2 | 11/2005 | Cowles et al. |
| 2003/0137030 A1 | 7/2003 | Lunde |
| 2003/0234393 A1 | 12/2003 | Cowles et al. |

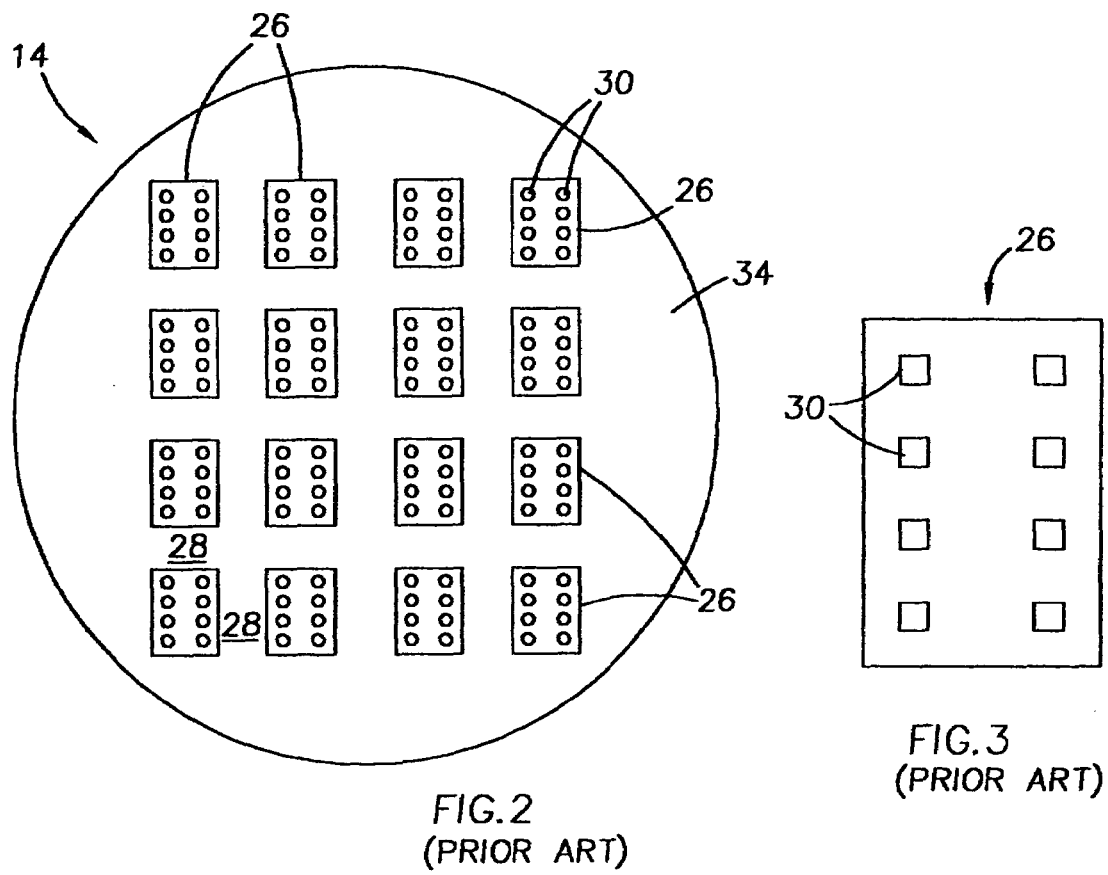
FIG.2 (PRIOR ART)
FIG.3 (PRIOR ART)
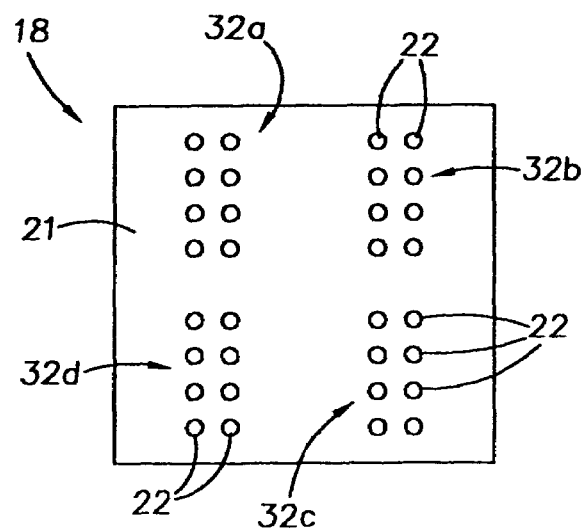
FIG.4 (PRIOR ART)

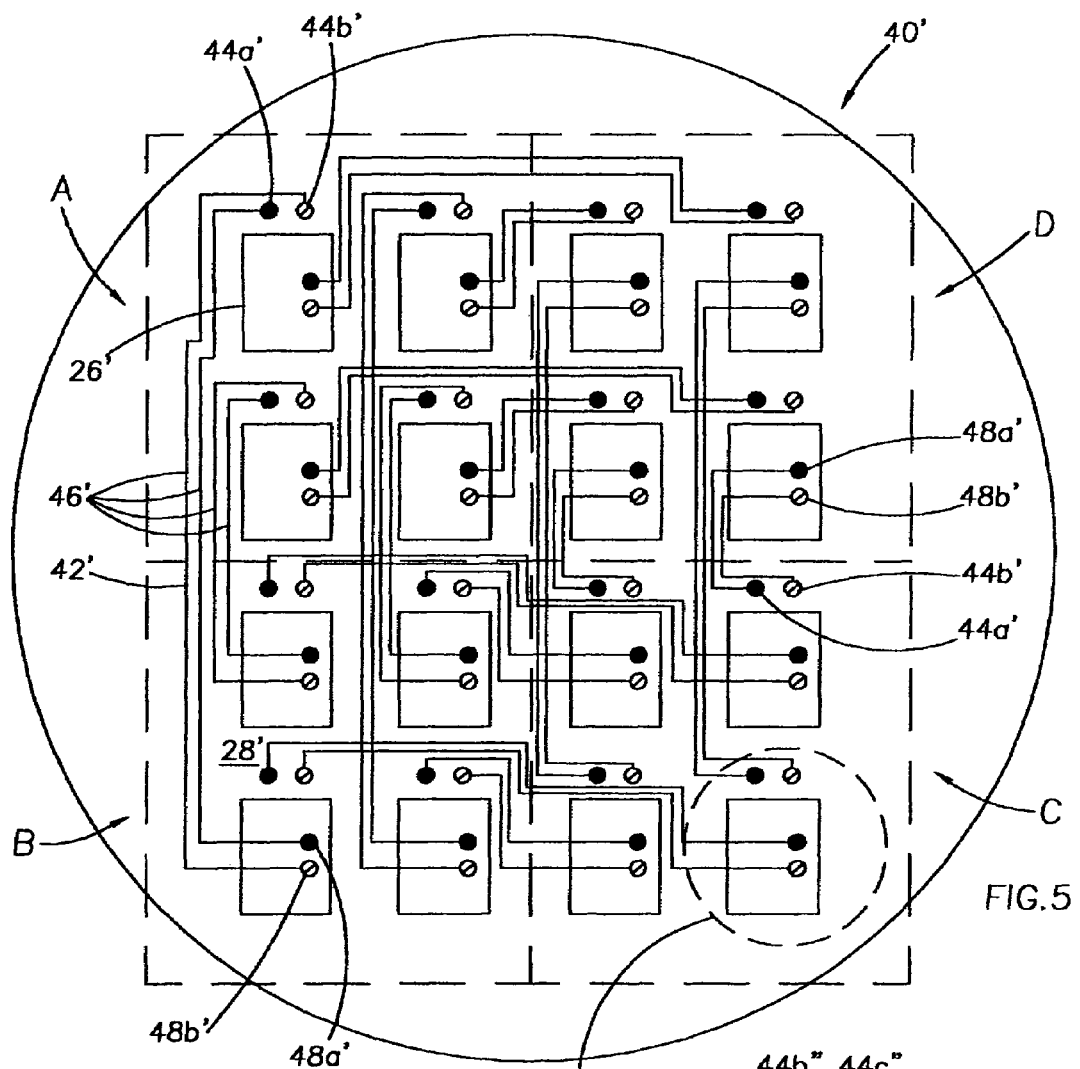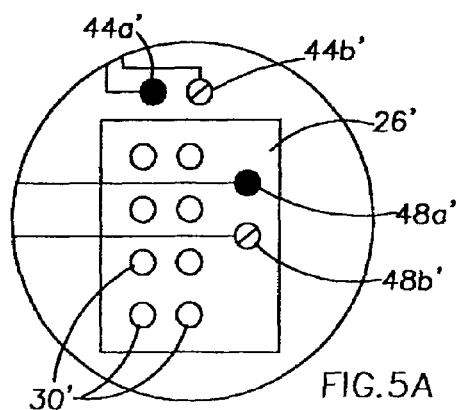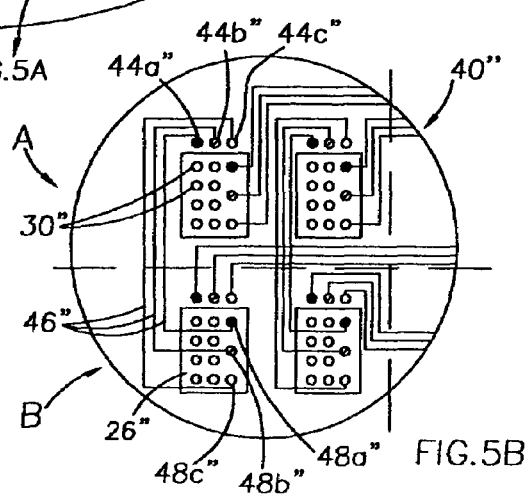

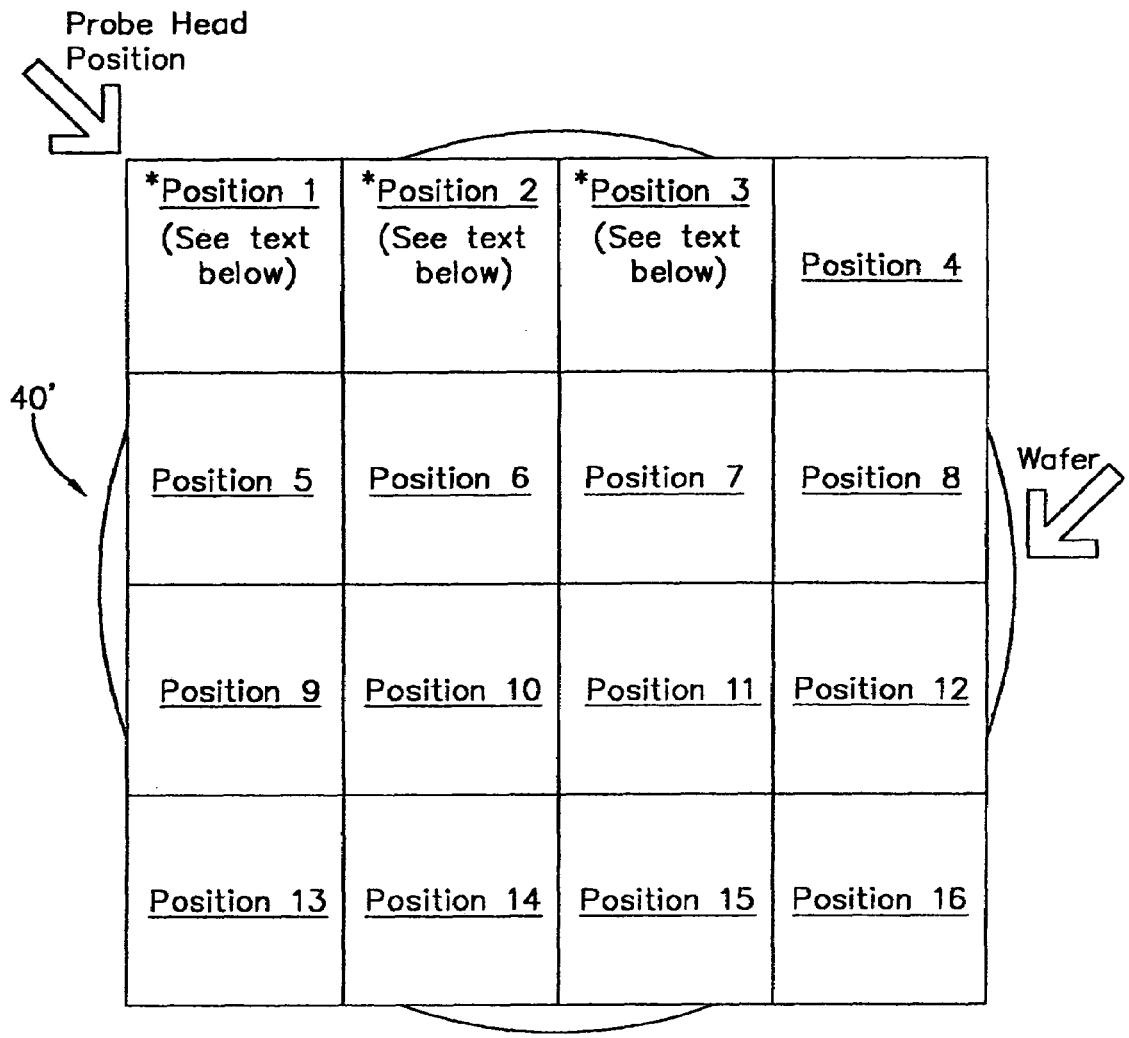

FIG.12

*Position 1
Step 1: BISS stress
Step 2: Begin normal PROBE test and repair flow

*Position 2
Step 1: <<idle>>
Step 2: BISS stress at the same time that the regular PROBE testflow is being run at Position_1
Step 3: Begin normal PROBE test and repair flow

*Position 3
Step 1: <<idle>>
Step 2: <<idle>>
Step 3: BISS stress at the same time that the regular PROBE testflow is being run at Position_2
Step: 4 Begin normal PROBE test and repair flow

PROBE LOOK AHEAD: TESTING PARTS NOT CURRENTLY UNDER A PROBEHEAD

CROSS-REFERENCE TO RELATED APPLICATIONS

This application is a divisional of U.S. Ser. No. 10/654,655, filed Sep. 3, 2003, pending, which is a divisional of U.S. Ser. No. 10/178,111, filed Jun. 24, 2002, now U.S. Pat. No. 6,630,685.

FIELD OF THE INVENTION

This invention relates to testing of semiconductor dies disposed on a semiconductor substrate.

BACKGROUND OF THE INVENTION

After a semiconductor wafer has been fabricated, a number of the dies on the wafer are inoperable. Manufacturers of semiconductor devices typically test the individual dies for functionality prior to singulation into individual dies, to evaluate various electrical parameters of the integrated circuit components contained on each die, and verify that certain standards are met. Integrated circuits (IC) devices typically undergo three separate test cycles: (1) in-process testing and monitoring of sheet resistivities, junction depths, and device parameters such as current gain and voltage breakdown; (2) wafer-probe testing of electrical parameters prior to die separation; and (3) final testing of reliability and performance after die packaging is completed. Testing of ICs is expensive and time consuming, and it is desirable to keep testing costs low since these add directly to the cost of producing the parts.

Semiconductor wafers are typically subjected to test probing tested prior to singulation into individuals dies using a wafer-level test system. As illustrated in FIG. 1, a typical test system 10 includes a wafer handler 12 for handling and positioning the wafers 14, a test circuit 16 for generating test signals, a probe card (probe head) 18, and a probe interface board 20 for routing signals from the test circuit electronics to the probe card 18. The wafer probe card 18 typically includes multiple probe elements 22, typically in the form of probe pins or needles, for making temporary electrical connections with contacts on the dies disposed on the wafer 14, the contacts typically in the form of bond pads, fuse pads or test pads arranged in a dense area array. The wafer handler 12 typically includes a wafer chuck 24 configured to move in X and Y directions (i.e., horizontally backward-forward and side-to-side) to align the wafer 14 with the probe card 18, and in the Z direction (vertically up-down) to move the wafer into contact with the probe pins 22. Exemplary prior art test systems are described, for example, in U.S. Pat. No. 6,300,786 (Doherty, et al.) and U.S. Pat. No. 6,246,245 (Akram et al.), both assigned to Micron Technology, Inc.), the disclosures of which are incorporated herein.

An example of a prior art semiconductor wafer 14 is illustrated in FIGS. 2–3. The wafer 14 includes multiple semiconductor chips or dies 26 fabricated using processes that are well known in the art. The dies 26 are typically singulated by use of a wafer saw, which grinds the wafer 14 along wafer scribe lines 28, usually referred to "streets" or "avenues", that separate the dies 26 from each other. As shown in FIG. 3, each die 26 includes multiple die pads 30. The die pads 30 are in electrical communication with integrated circuits contained on the die 26. For illustrative purposes, each die 26 includes eight die pads 30, which is merely exemplary. The die pads 30 are illustrated as bond pads, but can also be dedicated test pads or fuse pads, disposed on the dies 26 or on other portions of the wafer 14.

Conventionally, each die on a wafer is tested by placing the probe elements 22 of a probe card connected to a test system on the pads 30 of the die. The test system supplies the proper power levels and signals to the pads on the die.

An example of a prior art probe card 18 is illustrated in FIG. 4, and typically comprises an insulating substrate 21, such as a glass filled resin, that includes electric traces (not shown) in electrical communication with the contacts or probe pins 22. The probe pins 22 on the probe card 18 are arranged in patterns corresponding to the patterns of the die pads 30. The probe pins 22 can be configured to make electrical connections with the die pads 30 on a specific die 26 or, as in the illustration in FIG. 4, with a group of dies (i.e., four dies) on the wafer. The probe pins 22 on the probe card 18 are arranged in groups 32a–d and configured on the substrate to correspond to the pattern of the die pads 30 on the die 26 to be contacted. Each group 32a–d of probe pins 22 represents a single test site. Typically, two or more test sites are included on the probe card 18 to accommodate testing of multiple dies at the same time. The probe card 18 can be formed with any desired number of test sites. The probe card 18 can also be configured to test a complete semiconductor wafer 14, or a portion of the dies 26 in a partial wafer. In the illustrated example in FIG. 4, the probe card 18 includes four test sites such that four dies 26 on the wafer 14 can be tested simultaneously. During a test procedure using a probe card, stepping techniques can be used to step the wafer 14 or the probe card 18, and test a number of dies 26 within a section on the wafer until all the dies 26 on the wafer have been tested. In those cases where dies 26 are positioned along the peripheral edge of a round wafer 14 (not shown), some of the probe pin groups 32a–d may not have an associated die under test, and the software that controls the stepping process is typically programmed to register valid test sites.

Manufacturers of semiconductor memory devices typically perform several operations on each device to examine various electrical parameters of the device and verify that certain minimum standards are met. A full range of functionality and timing characteristics of the memory devices are tested in order to determine if there is a defect in the array of cells that may fail over time. The test system 16 can transmit specific combinations of voltages and currents and/or signals to the probe interface board 20 and through the probe pins 22 of the probe card 18 to dies 26 under probe on the semiconductor wafer.

Burn-in stressing of dies is typically performed to accelerate failure using elevated voltage and temperature levels to stress, and determine operable voltages, currents, and temperatures. The test system can also run diagnostic tests on the memory device(s), which includes furnishing a sequence of commands (e.g., address, data and control signals) to the memory device for storing first data in memory cells of the memory device. The memory device can perform operations in response to the commands, and the operations synchronized to a clock signal. After the sequence, second data can be read from the memory cells and the first and second data can be compared to detect memory speed, timing, failures, and so forth. The integrated circuits that do not meet specification can be marked or mapped in software. Following testing, defective circuits can be repaired by actuating fuses (or anti-fuses) to inactivate the defective circuitry and substitute redundant circuitry.

In addition to the use of an external test system, memory testing can also be performed by means of a built-in self-test (BIST) circuit, which incorporates test circuitry and test data into the die 26 itself. In a BIST operation, the die is run in a way similar to how it is ultimately meant to be run. Activating BIST circuitry requires a Vcc power source, GND ground potential, and can also require signals from a test system. On a wafer level, the BIST circuitry can be disposed in the scribe lines ("streets") 28 between dies 26 or in the unused edge portions along the periphery 34 of the wafer 14, or can be included within the dies 26 themselves.

Because each memory cell or bit of the memory device must be tested, the time and equipment necessary for testing memory devices represents a significant portion of the overall manufacturing cost of such devices. The more chips that can be tested simultaneously, the greater the savings in testing time and manufacturing cost per chip. Still more time could be saved if different testing protocols could be performed on a plurality of memory devices simultaneously.

SUMMARY OF THE INVENTION

The present invention provides a semiconductor substrate, a probe card, and a method for stressing and/or testing dies on a semiconductor substrate.

In one aspect, the invention provides a semiconductor substrate structured for testing and/or stressing a semiconductor die. In one embodiment according to the invention, the semiconductor substrate, typically a semiconductor wafer, comprises dies disposed thereon and a metal layer (redistribution layer (RDL)) for re-routing the requisite power, ground, and signals from a test system into dies on the wafer substrate that are not in contact with probe elements of the test system. The RDL layer enables a path into a die from a location other than the original die pad currently being probed. The semiconductor substrate can comprise a plurality of die sets, and each die can comprise one or more pads for contact with an element (e.g., probe pin) of a probe card.

Two or more look-ahead pads or contacts (probe contacts) are associated with each die set in addition to the pads on the dies themselves. The look-ahead contacts can be positioned on the semiconductor substrate or on a die itself, such that when the pads of the dies of a die set are probed, the look-ahead contacts associated with that die set are also probed. Each look-ahead contact is electrically connected through a trace to a contact (pad) that is electrically connected to at least one die of a die set not currently being probed. A look-ahead contact can be electrically connected to one or more dies of a die set. When the look-ahead contact is probed, the requisite power, ground, and signals from a test system are routed through the traces to the die(s) of the die set not currently being probed. For example, the look-ahead contacts can include a power supply voltage (Vcc) contact and a ground potential (GND) contact and any number of signal contacts for receiving signals from an external source. The number of signal contacts can vary from one to as many as can be accommodated in a particular application.

In embodiments of the semiconductor substrate, the dies can comprise a built-in self-stress (BISS) circuit and/or a built-in self-test (BIST) circuit, and/or the semiconductor substrate can comprise a BISS and/or BIST circuit disposed thereon that is associated with a die set and electrically connected to at least one die of the die set. The BISS and/or BIST circuit can be electrically connected to look-ahead contacts through traces.

In another embodiment of the semiconductor substrate, the dies can be connected through traces to look-ahead contacts to gain access to the circuitry of the dies, and provide the required Vcc power, GND ground, and signals for running the die according to a product data sheet or for running an accelerated operation for stressing or testing, among other operations.

In another aspect, the invention provides a probe card for electrically probing pads of dies of a die set disposed on a semiconductor substrate and two or more look-ahead contacts that are associated with the die set. Each look-ahead contact is connected by a trace to at least one die of a die set not currently under probe to re-route the appropriate power, ground, and signals from a test system to the dies. In one embodiment, the probe card comprises a substrate having a first set of probe elements disposed thereon for contact with pads of dies of a die set, and a second set of two or more probe elements disposed thereon for contact with the look-ahead contacts associated with the die set. The probe elements can be in the form, for example, of pins, needles, bumps, among other constructions.

In yet another aspect, the invention provides a method of stressing/testing dies on a semiconductor substrate. In one embodiment, the method comprises the steps of:

providing a semiconductor substrate having at least a first set and a second set of dies disposed thereon, and two or more look-ahead contacts proximal to the first die set; each die comprising two or more pads for contact with elements of a probe tester; and each look-ahead contact electrically connected through a trace to at least one die of the second die set;

providing a test system comprising a test circuit and a probe device; the probe device comprising a substrate having a first set of probe elements disposed thereon for contact with the pads of the dies, and a second set of probe elements for contact with the look-ahead contacts; and contacting the probe elements with the pads of the dies of the first die set and the look-ahead contacts proximal to the first die set, to transmit the required Vcc power, GND ground potential, and signals from the test system to the dies of the first die set and through the look-ahead contacts and the traces to the dies of the second die set.

The method can further comprise initially stepping the probe card through the positions of the wafer to test the dies for opens/shorts.

In an embodiment of the method, required power, ground, and signals are transmitted from the test system to activate a built-in self-stress (BISS) circuit on or electrically connected to the dies and initiate a BISS operation on the dies. In another embodiment, the test system furnishes required power, ground, and signals to activate a built-in self-test (BIST) circuit and initiate a BIST operation in the dies. In yet another embodiment of the method of the invention, pads on the die necessary to operate the die for stressing or testing, for example, in a native or normal operation of the die (e.g., according to data sheet specifications), for accelerated operation, for testing a defined parameter, among others, are probed or connected through traces to look-ahead contacts, and the test system furnishes required power, ground, and signals to the pads on the die and the look-ahead contacts necessary stress or operate (WRITE and READ) the dies for testing.

In an embodiment of a method of probe testing dies of a semiconductor substrate according to the invention, in an optional first step, a probe card can be initially stepped through positions on the substrate to test the dies on the substrate for opens/shorts. A stress sequence can then be performed on the dies of a first die set under probe and the dies of a second die set (not under probe) that are electrically connected to the look-ahead contacts associated with the first die set. Subsequently, a test sequence (write and read) can be conducted on the dies of the first die set in contact with the probe elements. To test additional die sets, the probe card can then be moved to position the probe elements in contact with the dies and the look-ahead contacts of the next (second) die set, the look-ahead contacts connected through traces to dies of a third die set. A test of the dies of the second die set can then be conducted by furnishing required power, ground, and signals from the test system through the probe head elements into the dies of the second die set, while stressing the dies of the third die set by conducting required power, ground, and signals from the test system into the look-ahead contacts and through the traces to contacts of the dies of the third die set. The probe card is then moved to place the probe elements in contact with the die pads and the look-ahead contacts of the third die set and the foregoing stress/test operations are repeated on dies of the third and fourth die sets. The probe card is stepped through the remaining die sets, and stressing/testing proceeds until all the dies on the wafer have been stressed/tested.

Advantageously, the invention provides an apparatus and method for wafer probe stressing and testing whereby testing/stressing of dies in contact with elements of a probe card of a wafer test system and dies not currently under direct probing can overlap or be performed substantially simultaneously. By conducting concurrent or overlapping testing of at least two die sets, for example, a memory test of dies under probe and stressing the dies located previous to and/or ahead of the current probe position and not currently under probe, significant savings are realized in the overall time required for burn-in stressing and testing of the dies on the wafer. The probe step of the present method using a look-ahead contact can also run at higher than ambient (80° C.) temperature in certain part or die modes, which can reduce or eliminate the need for burn-in stress once the dies are singulated, thus reducing costs and problems that can affect the functioning of the die and conserving the life expectancy of the die. Stressing can be used in addition to burn-in testing as a preliminary level of testing to identify and eliminate marginal defective devices. This can significantly reduce the failure rate at a subsequent burn-in test phase. In addition, as a result of early detection of defective failed or weak components, redundant components can be engaged prior to singulation and individual packaging, or if not, the defective die can be discarded before additional costs are incurred during packaging.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIG. 2 is a top plan view of a prior art semiconductor wafer containing multiple semiconductor dies.

FIG. 3 is a top plan view of a prior art semiconductor die of the wafer in FIG. 2, illustrating die contacts (pads) on an individual die.

FIG. 4 is a plan view of the probe card of the test system shown in FIG. 1 and taken along line 4—4, showing probe pins grouped for simultaneous contact with four dies on the wafer of FIG. 2.

FIG. 5 is a plan view of an embodiment of a semiconductor substrate according to the invention, showing the semiconductor substrate with multiple dies (omitting the die pads) and a redistribution layer including two look-ahead contacts associated with each die and interconnected by traces to contacts on a die of another die set. FIG. 5A is a partial view of a die located on the semiconductor substrate of FIG. 5, showing the die pads. FIG. 5B is a partial plan view of another embodiment of a semiconductor substrate according to the invention showing three look-ahead contacts associated with each die and connected to contacts on a die of another die set.

FIG. 12 is a schematic plan view of another embodiment of a process flow for stressing/testing dies according to the invention.

DETAILED DESCRIPTION OF THE PREFERRED EMBODIMENT

The invention will be described generally with reference to the drawings for the purpose of illustrating embodiments only and not for purposes of limiting the same. The figures illustrate processing steps for use in fabricating semiconductor devices in accordance with the present invention. It should be readily apparent that the processing steps are only a portion of the entire fabrication process.

In the current application, the terms "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments or wafers described above.

One embodiment of a semiconductor substrate fabricated for the testing of dies in accordance with the invention is shown in FIG. 5. The substrate 40', typically a semiconductor wafer, comprises a plurality of dies 26' formed thereon through etching, deposition, or other well known techniques, and separated by scribe lines or streets 28'. As depicted in FIG. 5A, in the illustrated embodiment, each of the dies 26' includes a series of eight die pads 30', which is merely exemplary and typically numbers 28 to 30.

Figure 6A:
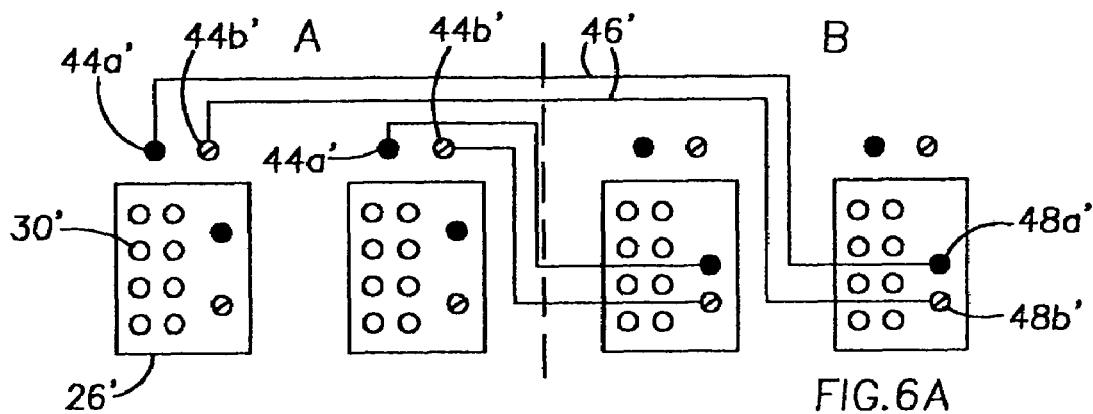
FIG. 6A is a partial plan view of the semiconductor substrate of FIG. 5, showing the look-ahead contacts and trace connections to contacts on dies of another die set (B).

According to an embodiment of the invention, the substrate 40' further includes a redistribution layer (RDL) 42' to redistribute a signal received from a test system (tester) at a point proximal to one set of dies currently in contact with elements of a probe card ("under probe") to one or more dies located in another section of the substrate not currently under probe. By "under probe", it is meant that the probe pins of a probe card are placed into contact with pads 30' of the dies 26'. As shown in FIGS. 5 and 6A, the redistribution layer 42' comprises look-ahead contacts 44a', 44b', each interconnected through a conductive trace (metal line) 46' to contacts 48a', 48b', respectively, of dies not currently under probe. As depicted, two look-ahead contacts are provided, which is merely exemplary, and can include, for example, a first contact 44a' for receiving a power supply voltage (Vcc) and a second contact 44b' for receiving a ground potential (GND) from a source such as an external test system.

In another example depicted in FIG. 5B, the look-ahead contacts can include a Vcc contact 44a", GND contact 44b", and a signal contact 44c" for receiving signals from a test system that are routed to contact 48c" on the die. The signal pad 30" or contact 48c" can be unique for receiving a signal for a particular application to stress or test the dies in a desired fashion. The number of look-ahead contacts can be increased to add potential for transmitting additional signals to the dies of a remote die set to achieve appropriate stressing or testing of the dies. For illustrative purposes, FIG. 5B depicts substrate 40" with three look-ahead contacts 44a", 44b", 44c" associated with contacts 48a", 48b", 48c", located on each die 26", which is merely exemplary.

The look-ahead contacts 44a', 44b' are positioned on the semiconductor substrate proximal to dies of a die set to be tested under probe. In the embodiment illustrated in FIGS. 5 and 6A, the look-ahead contacts 44a', 44b' are located in the streets 28' adjacent each die 26' of a first die set (Section A), and electrically connected by a conductive trace 46' to a contact 48a', 48b' associated with a die 26' of a second die set (Section B).

Figure 6B:
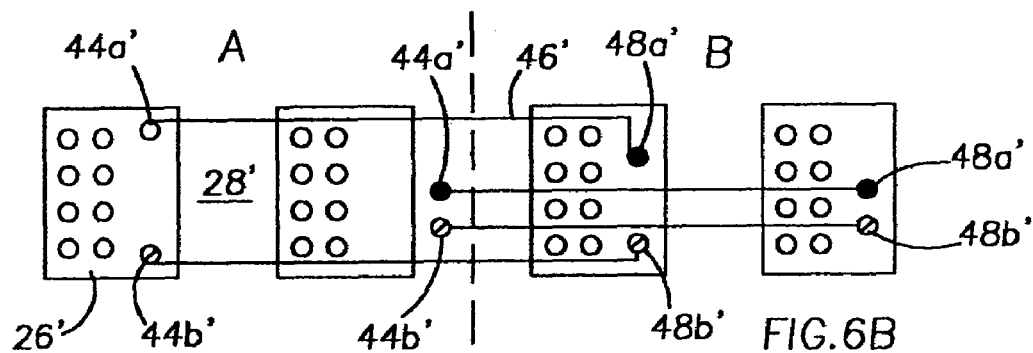
FIG. 6B is a partial plan view of another embodiment of a semiconductor substrate showing look-ahead contacts located directly on the dies or in the streets between dies, and connected by traces to contacts on dies of another die set (B).
Figure 6C:
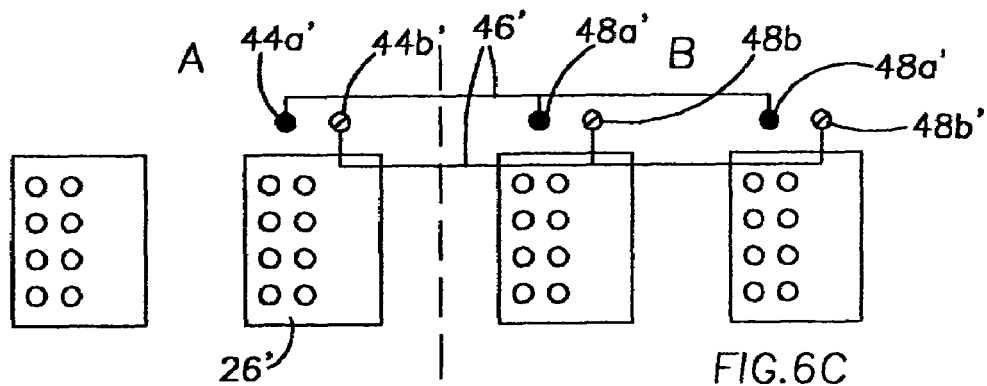
FIG. 6C is a plan view of another embodiment of a semiconductor substrate showing look-ahead contacts connected to more than one die in a second die set (B).
Figure 6D:
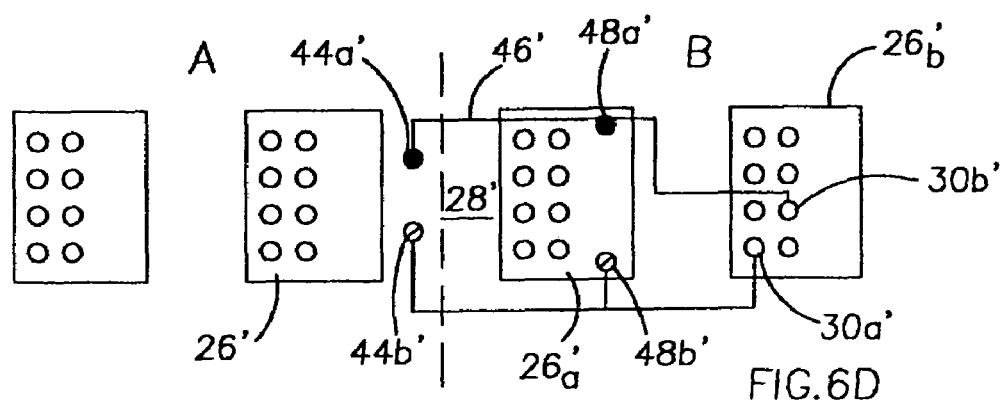
FIG. 6D is a plan view of another embodiment of a semiconductor substrate showing look-ahead contacts associated with a first die set (A) connected to contacts and to pads of dies of a second die set (B).

In another embodiment of a semiconductor substrate according to the invention, shown in FIG. 6B, the look-ahead contacts 44a', 44b' can be located on the dies 26' themselves and/or on the semiconductor substrate 40', for example, in the streets 28' between dies 26'. FIG. 6B also illustrates the connection of separate look-ahead contacts 44a', 44b' and traces 46' to each die in a second die set (Section B) which allows for more individualized testing of dies in the second die set. FIG. 6C illustrates another embodiment of a semiconductor substrate in which the look-ahead contacts 44a', 44b' (Section A) each connect to a contact 48a', 48b' of more than one die 26' of a second die set (Section B). By interconnecting a look-ahead contact 44a', 44b' to a plurality of dies 26' in a second die set (e.g., Section B), the number of look-ahead contacts and corresponding probe pins needed to connect with dies in a second die set can be significantly reduced. Contacts 48a', 48b' of FIG. 6C are located off the dies on the semiconductor substrate, and can be interconnected to circuitry (e.g., BISS and/or BIST circuitry) located on the die (not shown). FIG. 6D depicts yet another embodiment of a semiconductor substrate of the invention in which the look-ahead contacts 44a', 44b' (shown as located in street 28') of a first die set (Section A) are routed to contacts 48a', 48b' disposed on die $26_a$' of a second die set (Section B). The signal can also be directly routed to the appropriate die pads 30a', 30b' of die $26_b$' within the second die set. As shown in the illustrated examples, the conductive traces 46' can run along streets 28' between dies and/or over dies 26'. The locations and configurations of the look-ahead contacts 44a', 44b', trace connections 46', and contacts 48a', 48b' or other connections (e.g., die pads 30a', 30b') to the dies of a second die set illustrated in FIGS. 6A–6D, can be provided in various combinations or other variations as appropriate to achieve a stressing/testing protocol according to the invention.

The RDL 42' can be formed on the semiconductor substrate 40' in conjunction with processing steps to form the pads 30', using known methods in the art, for example, by chemical vapor deposition (CVD), patterning, etching, electroplating, stenciling, and screen printing. The look-ahead contacts 44' can comprise a conductive metal or metal alloy such as aluminum, aluminum alloy, titanium, tungsten, titanium-tungsten alloy, tantalum, platinum, copper, or refractory metal silicide, among others. The traces 46' can comprise a metal or alloy such as copper, aluminum, silver or gold, among others, a conductive polymer material, or other suitable electrically conductive material.

Figure 7A:
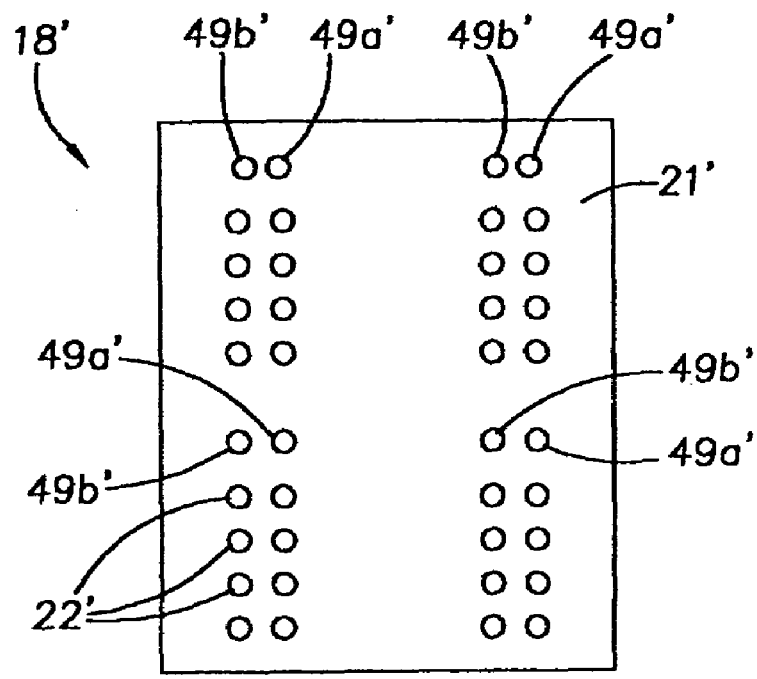
FIG. 7A is a schematic plan view of an embodiment of a probe card according to the invention showing probe pins grouped for contact with pads of four dies disposed on the semiconductor substrate of FIG. 5, and associated look-ahead contacts.
Figure 7B:
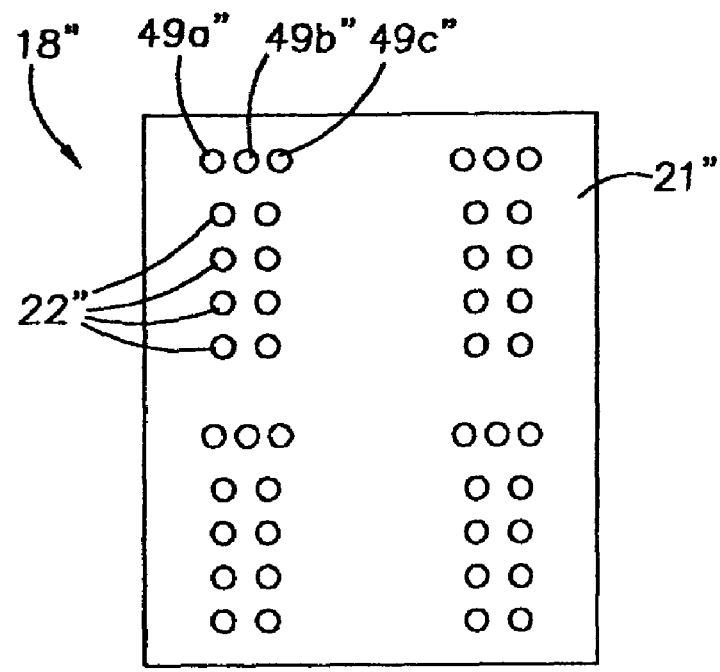
FIG. 7B is a schematic plan view of another embodiment of a probe card according to the invention with probe pins for contact with pads of four dies and associated look-ahead contacts as depicted in FIG. 5B.

A probe card 18', as depicted in FIG. 7A, can be used in conjunction with a semiconductor substrate 40' as depicted in FIG. 5, to probe the pads 30' and Vcc, GND look-ahead contacts 44a', 44b' to provide the required power and ground to implement the circuitry of the dies 30' being stressed/tested on the semiconductor surface 40'. The probe card 18' includes a substrate 21' with probe pins 22' for providing the appropriate power, ground (e.g., Vcc, GND), and signals to the die pads 30' of the dies under probe. The probe card 18' further includes probe pins 49a', 49b' to provide the requisite power supply voltage (Vcc) to Vcc look-ahead contact 44a' and ground potential (GND) to GND look-ahead contact 44b'. Another embodiment of a probe card 18" is depicted in FIG. 7B, and includes additional probe pins such as pin 49c" for supplying other power and signals (e.g., control signals) to additional look-ahead contacts such as look-ahead contact 44c" as illustrated in FIG. 5B, to initiate a stress or test operation, for example.

Figure 8:
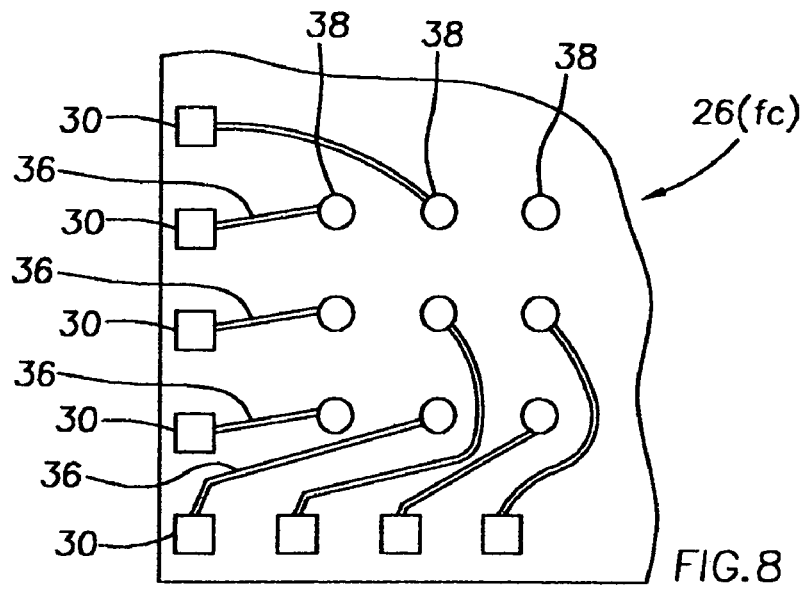
FIG. 8 is a schematic plan view of the active surface of a prior art flip chip showing a redistribution layer (RDL) connecting bond pads to area array pads.

With a flip chip die configuration, the semiconductor chip is mounted in an upside-down manner onto a carrier substrate and electrically coupled by means of solder bumps provided on the active surface of the chip. As depicted in FIG. 8, an RDL 36 is typically used in flip chip constructions to redistribute bond pads 30 to area array pads 38 that are spaced at a fine pitch on the active surface of the chip 26(fc). Circuit probing of a flip chip 26(fc) can be performed by using a probe card that is designed to be electrically coupled to the internal circuitry of the flip chip via the area array pads 38.

Figure 9:
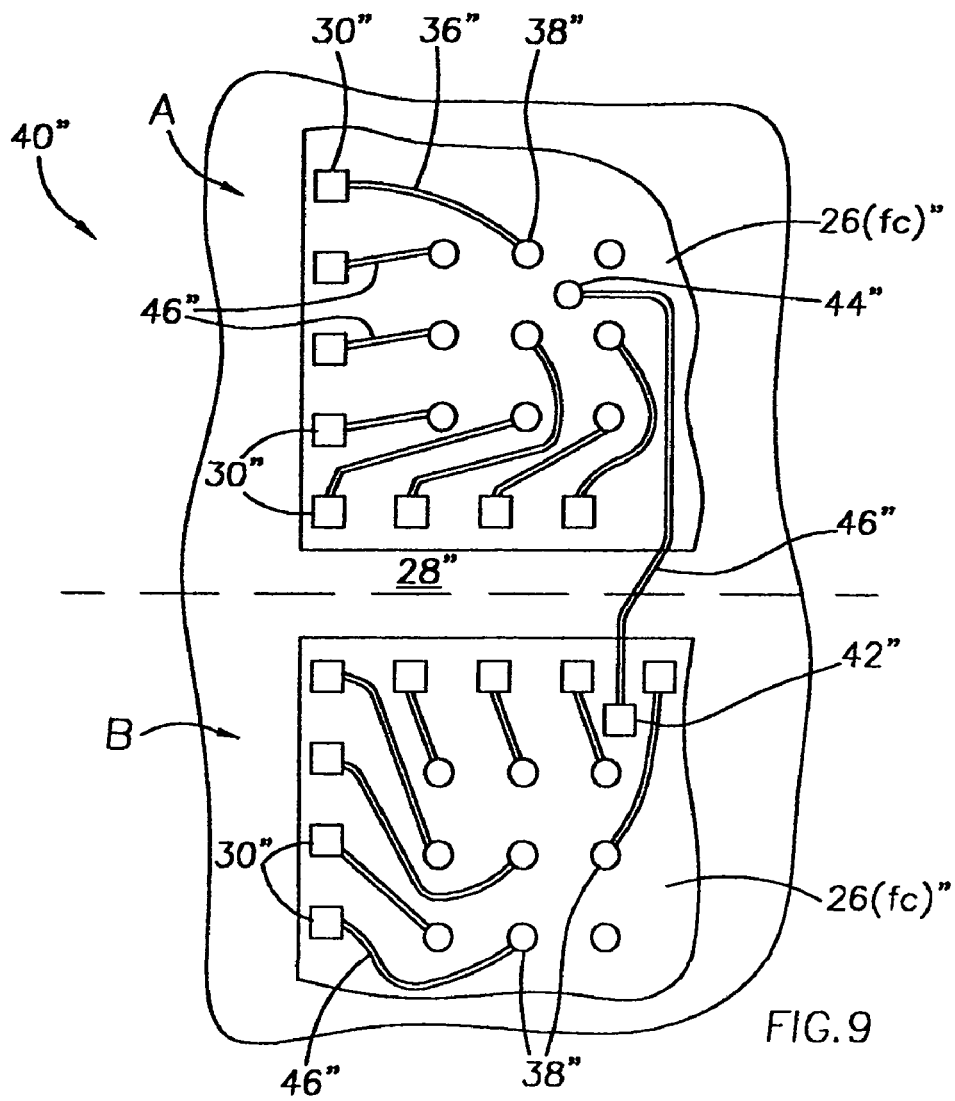
FIG. 9 is a schematic plan view of an embodiment of a semiconductor substrate according to the invention showing multiple flip chip dies having an RDL comprising bond pads connected to area array pads, and a look-ahead contact disposed on a die of a first die set (A) connected via a trace to a contact on a die of a second die set (B).
Figure 10:
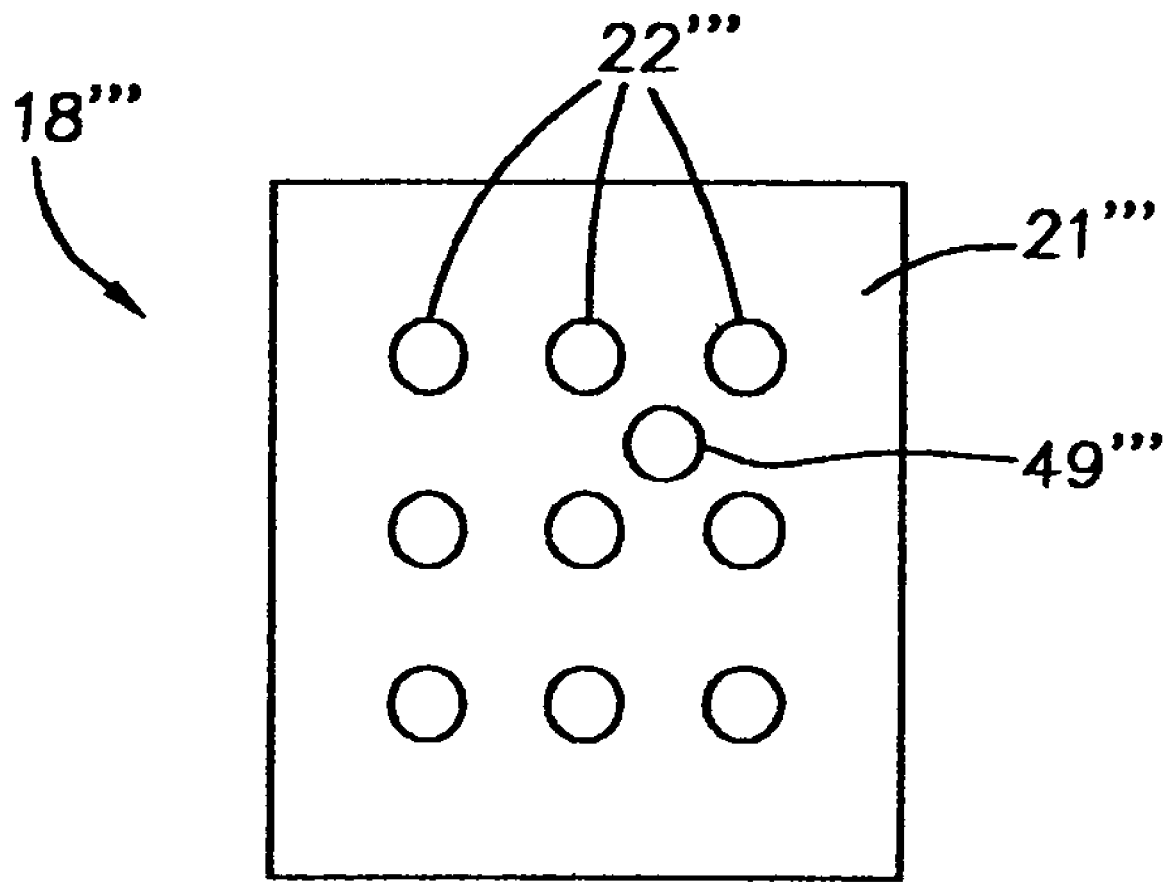
FIG. 10 is a plan view of another embodiment of a probe card according to the invention showing probe pins arranged for contact with the array pads disposed on the flip chip die of FIG. 9, and associated look-ahead contact.

Referring to FIG. 9, to implement the method of the invention for testing a substrate 40" comprising flip chip configurations, the RDL 36" for redistributing the flip chip bond pads 30" to area array pads 38" can be fabricated to include look-ahead contacts, for example, contact 44", located on or in connection with flip chip dies 26(fc)" of a first die set (Section A), connected to a trace 46" for routing the requisite power, ground, and signals to a contact, for example, contact 42" on or connected to one or more dies 26(fc)" of a second die set (Section B) located on the semiconductor substrate 40" prior to or after the current probe card position. As depicted in FIG. 10, a probe card 18'" can be configured to include probe pins 22'" for contact with the pads 38" of die 26(fc)'" of the first die set (A) and a probe pin 49'", for example, for contact with the look-ahead contact 44" associated with the first set of dies (A). The look-ahead contacts 44" and contacts 42" can be located on the die itself (as shown), in streets 28" between dies, and/or along the periphery of the substrate 40".

Stress/Test Circuitry

The present system can be utilized to cause stressing and/or testing of dies both under probe and outside of the current probe head position, that is, not currently in contact with the probe elements and located on the semiconductor substrate (wafer) at a position previous to or after the current probe head position. The stress/test mode can be run using built-in self-stress (BISS) circuitry and/or a built-in self test (BIST) circuitry that is incorporated into the die or the semiconductor substrate and connected with the die, for example. The stress/test mode can also be run via the typical mode of access as described in product data sheets or at an accelerated level by utilizing the appropriate signals, Vcc power and GND ground potential, routed from an external test circuit to the die circuitry.

BISS circuitry. A built-in self-stress (BISS) circuit can be used to implement stressing of memory cells and circuit nodes, for example, on the dies (chips or parts), without verification of the parts functionality. Referring to FIG. 5, the BISS circuit (not shown) can be incorporated into the integrated circuit of the dies 26' themselves, in a street 28' of the semiconductor substrate (wafer) 40', in an individual die location on the substrate in place of a die on that site, or in the location of a mutant die (not fully formed die) along the edge of a semiconductor substrate as a replacement to the mutant die on that site. The BISS circuit has the capability to exercise (stress) the dies, but lacks the ability to read and compare data to determine whether the die is functional.

The BISS circuit typically includes circuits to sequence through address lines, an address counter, an oscillator, a clock (CLK) generator, a timer, and other controls. A BISS circuit can comprise the signals within a die that are necessary to cause stress on the die, and can include activities that occur during a burn-in testing. For example, the die can be stressed by operating it for a period of time at different temperature cycles, including high temperatures and accelerated voltages, by causing cell plate to digit line stress, by exposing the die different patterns within its array, by opening multiple rows at the same time, by holding rows open, by increasing or decreasing timing cycles, by pulsing row lines, by conducting faster cycles for die heating, among other operations.

A semiconductor device can be stressed, for example, by changing the timing signals to the limits, or outside, of the intended parameters associated with normal operation. For example, a semiconductor device can be stressed by controllably adjusting the time durations of timing signals, and/or the voltage levels of the timing signals so that the time durations and voltage levels approach a value that is at or above the boundary of a specified margin. This adjustment alters the semiconductor device operation such that, if the device has a defect, it will fail and can then be identified.

Implementation of a BISS circuitry minimally requires a power supply voltage (Vcc) and a ground supply voltage (GND) to supply power to the circuitry. In one embodiment of implementing a stress sequence via a BISS circuit according to the invention, the dies 26' include separate pads 30' for receiving a power supply voltage (Vcc) and a ground potential (GND), and the look-ahead contacts disposed on the semiconductor substrate 40' comprise a Vcc contact 44a' for receiving Vcc power and a GND contact 44b' for receiving GND, as depicted in FIG. 5. In another embodiment depicted in FIG. 5B, the die 26' includes a die pad 30" and additional look-ahead contacts such as contact 48c" for receiving a signal, for example, a trigger signal, RAS, CAS, WRITE_ENABLE, I/O signals, or other signal, for implementing the BISS operation. Separate look-ahead contacts can be provided for each signal to be routed to the die not under probe.

A probe card 18', as depicted in FIG. 7A, can be used to probe the pads 30' and look-ahead contacts 44a', 44b' of a semiconductor substrate 40' as depicted in FIG. 5, for example. Probe pins 22' can be utilized to provide power and ground (Vcc, GND) to the appropriate die pads 30' of the dies under probe. The probe card 18' further includes at least two probe pins 49a', 49b' to provide a power supply voltage (Vcc) to the Vcc look-ahead contact 44a' and a ground potential (GND) to the GND look-ahead contact 44b'. As depicted in FIG. 7B, the probe card 18" can further include additional probe pins such as pin 49c" for supplying other power and signals, including control signals to look-ahead contacts such as contact 44c', for example, as depicted in FIG. 5B, for implementation of the BISS operation.

An embodiment of a BISS implementation step according to the invention can be described with reference to FIGS. 5–5A, and the probe card 18' depicted in FIG. 7A. The probe pins 22' of the probe card 18' are placed in contact with die pads 30' of the dies 26' of a first die set (Section A) and the probe pins 49a', 49b' are placed in contact, respectively, with the look-ahead contacts 44a', 44b' associated with the first die set (A). The probe card 18' supplies the required power and ground (Vcc, GND) through a probe pin 22' to appropriate Vcc, GND pads 30' on the dies (for those dies currently under probe) and through probe pins 49a', 49b', respectively to the Vcc, GND look-ahead contacts 44a', 44b' for routing through traces 46' to the Vcc, GND contacts 48a', 48b' associated with the dies 26' of the second die set (Section B), which are not currently in direct contact with probe pins 22'. The dies of the second die set can be located on the semiconductor substrate at a location before or after the current probe head position.

As depicted in FIGS. 6C–6D, the Vcc look-ahead contact 44a' in a first die set (e.g., Section A) can be connected by traces 46' to the Vcc contacts 48a' (and/or Vcc pads 30a') of two or more dies in a second die set (e.g., Section B). Likewise, the GND look-ahead contact 44b' in Section A can be connected by traces 46' to the GND contacts 48b' (and/or GND pads 30b') of two or more dies in a second die set (e.g., Section B). In such an arrangement, when the probe pins 49' are brought into contact with the look-ahead contacts 44a', 44b', power is supplied to all the dies of the second die set (B) at about the same time via the trace 46'.

In another embodiment, the BISS operation can be initiated upon receipt of the requisite power and ground (Vcc, GND) and appropriate signals ranging from a single trigger signal to all signals required for the particular BISS operation utilized. Referring to FIG. 5B, power and ground (Vcc, GND) and signals can be supplied to appropriate Vcc, GND and signal pads 30" on the dies under probe, and to the Vcc, GND and signal look-ahead contacts 44a", 44b", 44c" (e.g., in Section A) for routing through traces 46" to the Vcc, GND and signal contacts 48a", 48b", 48c" for the dies not currently under probe (e.g., Section B). Although a single signal look-ahead contact 44c" is depicted, additional signal look-ahead contacts can be provided to accommodate routing the required signals to signal contacts such as 48c" (or to die pads similar to routing to die pads 30a', 30b', as shown in FIG. 6D) for the dies not under probe to implement the BISS operation employed in a particular application.

The BISS operation, once initiated, automatically performs designed-in stress functions. Thus, by providing the requisite power, ground, and signals to a look-ahead contact at the current probe head position, stressing of dies not currently in contact with probe elements of the probe head can be achieved.

In a subsequent Probe Test, broken elements can be detected and repaired out. In this way, dies that would have eventually failed during a burn-in test (BURN) can be recovered at probe.

BIST circuitry. A built-in self-test (BIST) circuit can be used to automatically test the memory devices upon initiating a BIST operation, which typically involves challenging the part and retrieving information about the part to determine if it fails or is still functioning appropriately. A BIST circuit is conventionally designed to identify whether the die is defective, and the type of defect. BIST circuitry often generates stimulus for the circuitry being tested, which generates responses to be compared by the BIST circuit against expected responses. Referring to FIG. 5, as with a BISS circuit, a BIST circuit (not shown) can be incorporated into the integrated circuitry of the dies 26' themselves, in a street 28' of the semiconductor substrate 40', as a replacement for a die in an individual die location on the substrate, or as a replacement for a mutant die in a mutant die location on the substrate, typically along the edge of the substrate.

The BIST circuitry typically includes circuits to sequence through address lines, an address counter, an oscillator, a clock (CLK) generator, a timer, and other controls, for example, associated with a READ or WRITE operation, and a COMPARE operation. The BIST circuit would also require the routing of at least one I/O so that failed dies could be detected in die sets (DS) not currently under probe. A BIST circuit comprises the signals that are necessary to generate a clock (CLK) signal, and run through a predefined number of programmed operations triggered by the edges of the CLK signal.

Implementing the BIST circuitry minimally requires Vcc power and a GND ground potential, and the ability to retrieve data from the die as to whether or not the die passed or failed the BIST testing, for example, an input/output (I/O) pin or a fuse incorporated into the die that will be blown upon failure, among others.

An embodiment of implementing a BIST circuit according to the invention can be described with reference to FIG. 5B. As shown, look-ahead contacts 44a", 44b" for Vcc and GND, and additional look-ahead contacts such as 44c" can be provided for routing signals as required for the BIST operation. Utilizing a probe card 18" (FIG. 7B), Vcc power, GND ground, and signals (e.g., I/O) are supplied through the probe pins 22" to the pads 30" of the dies 26" under probe (e.g., Section A), and through the probe pins 49a", 49b", 49c" to the look-ahead contacts 44a", 44b", 44c", associated with the first die set (A). The required Vcc power, GND and signals are routed via the traces 46" to the Vcc, GND, and signal contacts 48a", 48b", 48c", respectively, on or connected with the dies 26" of the second die set (Section B), which are currently not under probe.

Upon receiving the Vcc, GND, and any required signals, the BIST circuit is activated. The BIST operation then automatically performs designed-in test functions, and stores the data from the test results in a status register. Data from each die can be fed back from the dies, for example, through an I/O contact to the external test circuit. By providing the requisite power, ground, and signals to look-ahead contacts at the current probe head position, testing of dies not currently under probe can be achieved.

Thus, in certain applications, a BISS circuit can be activated by utilizing a minimum of two die pads 30' and two look-ahead contacts 44a', 44b', and associated traces 46' for providing Vcc and GND to the die circuitry (FIG. 5). In a BIST and other BISS applications, required signals are routed through appropriate die pads 30" for dies under probe and look-ahead contacts 44c" for the dies not under probe (FIG. 5B).

In some instances, additional signals can be provided that enhance stressing and/or testing, and/or run a test operation that is special to a particular die. The number of look-ahead contacts and traces can be increased to accommodate such additional signals, with the maximum number of look-ahead contacts and traces being typically limited by the amount of physical space available on the semiconductor wafer.

Stress/Test using typical die circuitry. Stress and/or die testing can also be achieved by running the circuitry of the dies (used for normal operation) or, more typically, test mode circuitry built into the die for testing the die, by the application of power, ground, and required signals from an external test circuit, such as the test system 16 depicted in FIG. 1. A test system generally includes microprocessor circuitry, a system clock, and a memory for performing testing routines and storing and processing the results.

For stressing the dies, the test system sends Vcc power, GND ground potential, and necessary signals to stress the die circuitry, for example, power supply voltage (Vcc), ground potential (GND), input/output (I/O) signals, address signals, clock signals, data signals, and other signals as necessary for the die circuitry to be properly stressed. Stressing a die typically involves applying higher Vcc, opening multiple rows, holding rows open or pulsing the row lines, grounding or raising the cell plate voltages versus the digit line voltage, and the like.

For memory testing, the test circuit sends predetermined voltages and signals to a memory device of the die including, for example, power supply voltage (Vcc), ground voltage (GND), input/output (I/O) signals, address signals, clock signals, data signals, and other signals as necessary for the die to be properly tested. The test system typically writes test patterns to the memory device, reads the data stored in the memory devices, and determines whether a logic level written is present for a certain duration by comparing the data to a predetermined data pattern at a time referenced to a system clock signal CLK, in order to detect memory speed, timing, failure, and so forth. Based on the results of the tests, the test circuit determines if the memory device(s) of the die is faulty, and generates a yield map of the results.

Referring to FIG. 5, in an embodiment of a method of stressing dies (only) according to the invention by implementing normal die circuitry or a test mode circuitry, Vcc power and ground GND can be routed from a test system utilizing a probe card 18' (FIG. 7A) through probe pins 22' into the appropriate die pads 30" of the dies 26" currently under probe (Section A, for example), and through the probe pins 49a', 49b' into Vcc, GND look-ahead contacts 44a', 44b' to Vcc, GND contacts 48a', 48b' of dies 26' not under probe (Section B).

An embodiment of a method of stressing and/or testing dies according to the invention involving the normal (typical) die circuitry, or a test mode circuitry, can be described with reference to FIG. 5B. A test system sends Vcc, GND and signals necessary for stressing and/or testing dies utilizing a probe card 18", as depicted in FIG. 7B, through the probe pins 22" into the appropriate die pads 30" of the dies 26" under probe (e.g., Section A) and through the probe pins 49a", 49b", 49c" into the Vcc, GND, and signal look-ahead contacts 44a", 44b", 44c" via the traces 46" to Vcc, GND, signals contacts 48a", 48b", 48c" on or connected to the dies 26" not currently under probe (Section B). Data can be read from each die, determined as passing or failing, and then fed back from the dies to the test circuit.

Thus, stressing and/or memory testing of dies not currently under probe but within probe head positions that are previous to or occurring after the current probe head position, can be achieved according to the invention utilizing typical circuitry (or test mode circuitry).

Implementation

Figure 11:
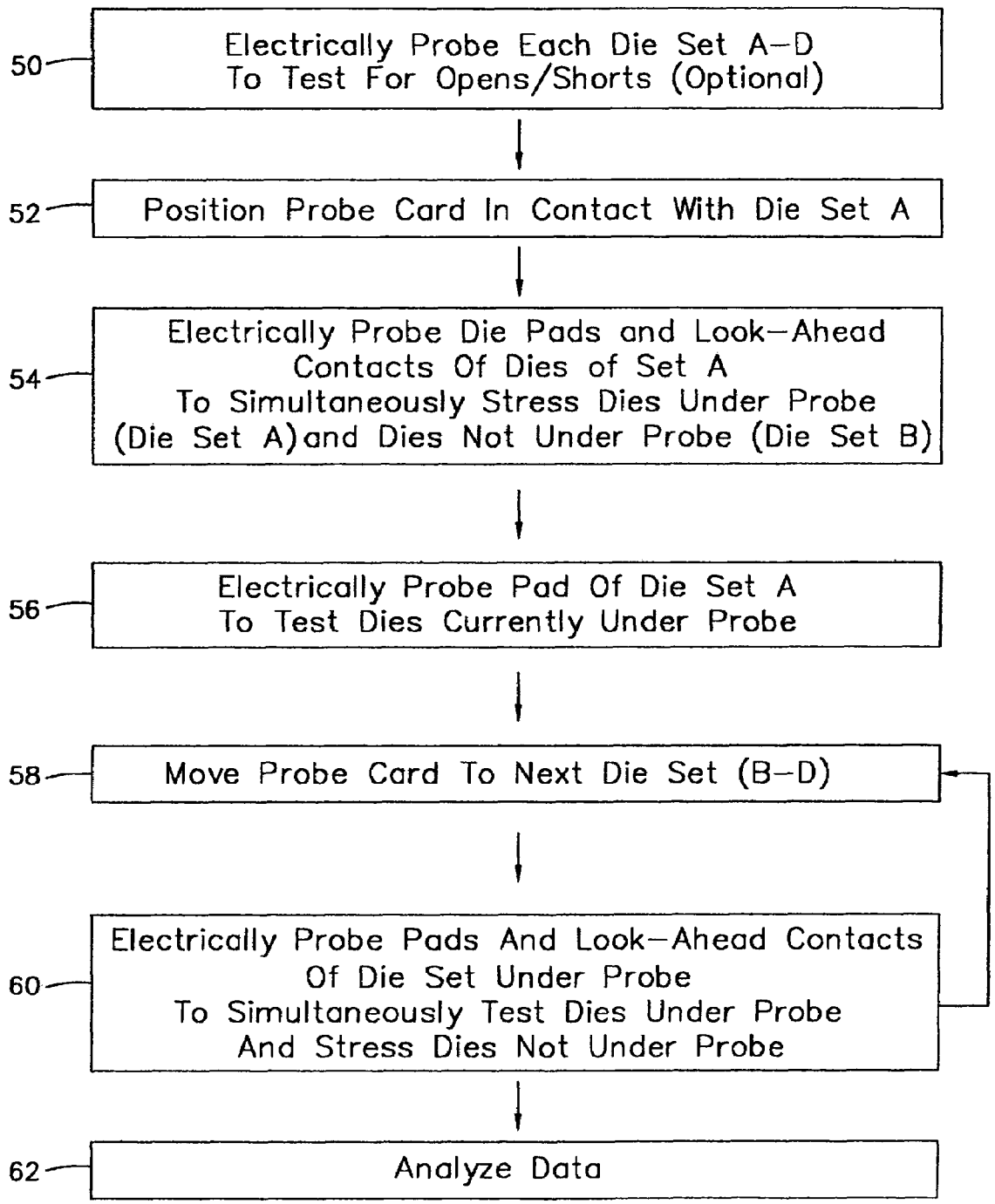
FIG. 11 is a block flow diagram of an embodiment of a process flow for stressing/testing dies on a semiconductor substrate according to the invention.

An embodiment of a wafer probe test according to the invention is illustrated in the process flow diagram of FIG. 11. Different circuitry as discussed above (BIST, BISS, typical die circuitry or a test mode circuitry) can be employed.

Figure 1:
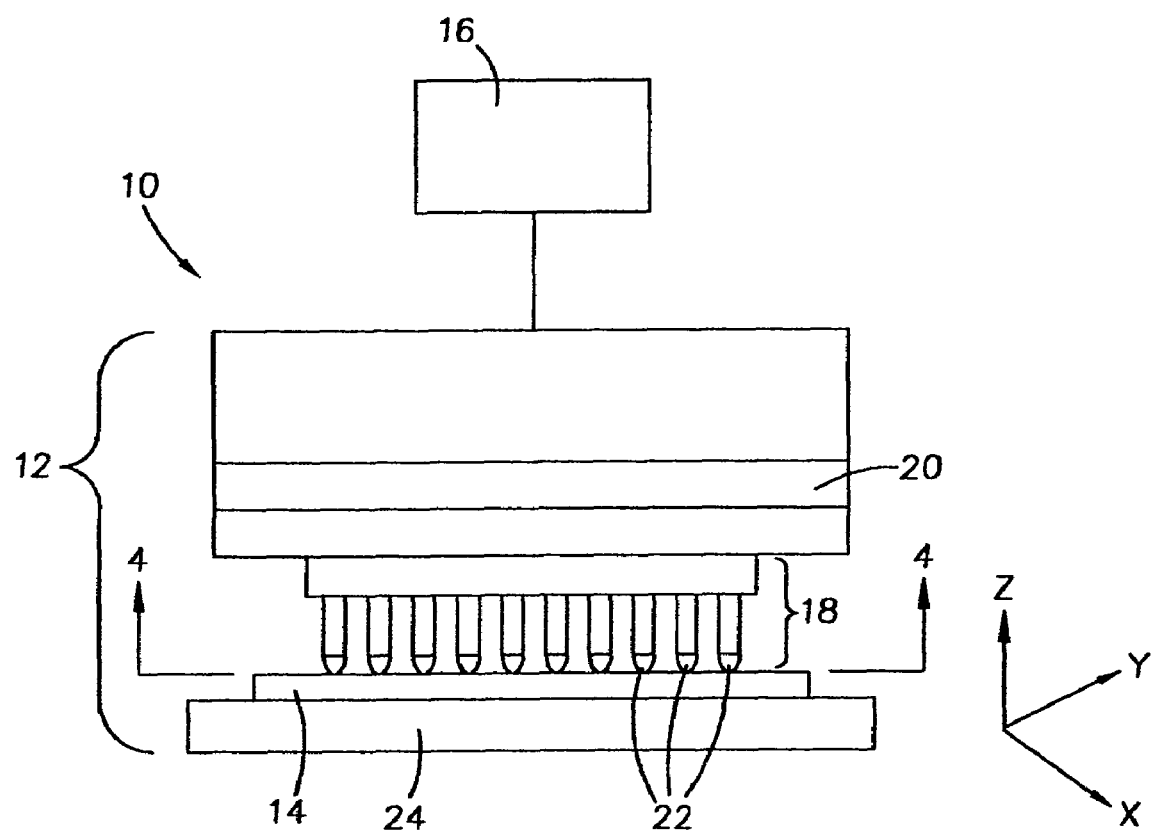
FIG. 1 is a schematic cross-sectional view of a prior art test system.

In implementing an embodiment of a probe test according to the invention, a semiconductor substrate (wafer) 40' such as that depicted in FIG. 5, is positioned within a test system such as that illustrated and described with reference to FIG. 1. The test system includes a probe card 18', as exemplified in FIG. 7A, that is configured with probe pins 22' for contact with die pads 30' of each die 26' within a defined set of dies (A–D) on the substrate 40'. The probe card 18' also includes probe pins 49a', 49b' for contacting the Vcc and GND look-ahead contacts 44a', 44b' positioned proximal to dies 26' of a die set that is currently under probe. The probe card is structured with an appropriate number of probe pins 22' to correspond to the number of die pads 30' of dies 26', and probe pins 49a', 49b' to correspond to the look-ahead contacts 48a', 48b' to be contacted under the current probe card position.

In an embodiment of a probe test according to the invention, the probe card 18' can be stepped across the semiconductor substrate 40' starting with die set A, and proceeding in sequence across the substrate to die sets B, C and D, as depicted in FIG. 5.

As diagrammed in FIG. 11, implementation of the probe test can involve an optional initial Test Step 50 to determine Opens and Shorts in all probe head positions (i.e., A through D). The probe card 18' can be sequentially stepped through each probe head position to test for shorts and generate a map of the locations of bad (shorted) devices (dies). In the subsequent stress/test phases, shorted dies will not be provided with "look-ahead signals" in order to avoid damaging the substrate (wafer) or other dies on the substrate.

Where a preliminary screening test to identify opens/shorts of dies is not initially conducted, the probe electronics can be utilized to detect bad parts and to shutdown signals to those units automatically.

After completion of the initial open/shorts Test Step 50 (if implemented), stress/test steps are conducted on the dies on the semiconductor substrate.

In Step 52, in the illustrated example, probe card 18' is positioned at a first probe head position at a first die set (e.g., Section A). The probe pins 22' electrically probe die pads 30', and the probe pins 49a', 49b' probe the look-ahead contacts 44a', 44b'. In the present illustration, the look-ahead contacts 44a', 44b' are utilized for routing Vcc power and ground GND to dies located on the semiconductor substrate 40' that are not currently under probe (i.e., not in contact with probe pins 22').

In Step 54, stressing is performed to detect defects in the dies that may fail overtime. Stressing can be performed to accelerate failure by applying elevated power supply voltage levels and by heating and cooling a die in a chamber, and by accessing certain circuit nodes with different voltage levels that result in stress on a memory cell or the physical/electrical nature of a die. The test circuit provides the necessary power and ground to implement the stress operation or sequence through the probe pins 22' to the appropriate die pads 30' and circuitry (not shown) of the dies 26' in a first die set currently under probe (Section A), and through probe pins 49a', 49b' to the look-ahead contacts 44a', 44b and through traces 46' to contacts 48a', 48b' (and/or pads 30a', 30b'; FIG. 6D) of dies 26' in a second die set (e.g., Section B) that is remote from the probe head 18' set (i.e., not currently under probe). The Vcc power and GND can be supplied substantially simultaneously to the dies in the first die set (A) and the second die set (B) such that the stress operation in the two (or more) die sets overlaps or occurs substantially simultaneously. Thus, a stress operation can be performed substantially simultaneously on the dies of both the first die set (A) under probe and the second die set (B) without direct probing of the die pads 30' of the dies of second die set (B).

Upon completion of Stressing Step 54, testing-in of the dies 26' in the first die set (A) is conducted in Step 56. With the probe card 18' remaining in position with the probe pins 22' in contact with the pads 30' of the dies of the first die set (A), the necessary Vcc power and GND are furnished to the dies under probe to implement testing of the dies, such as data retention tests and/or data march tests. Based on the results of the tests, the test system determines if the die is faulty, and can generate a yield map of the results.

Upon completion of the testing of the dies of the first die set (A), the probe card 18' is then moved to the next probe head position with the probe pins 22' in contact with the pads 30' of the dies 26' of the second die set (B), and the probe pins 49a', 49b' in contact with the look-ahead contacts 44a', 44b' associated with the second die set (B) (Step 58).

In Step 60, full testing of the dies 26' in the second die set (B) now under probe can be conducted substantially simultaneously with stressing of the dies 26' in the third die set (C) (not currently under probe) connected through traces 46' to the look-ahead contacts 44a', 44b' associated with the second die set (B). To implement Step 60, probe pins 22' electrically probe the die pads 30' of the dies in the second die set (B), and the necessary Vcc power and GND ground (and signals) to implement the testing operation are sent by the external test system through the probe pins 22' to die pads 30' of the dies 26' under probe to implement testing of the dies. At about the same time, probe pins 49a', 49b' electrically probe the look-ahead contacts 44a', 44b' associated with the dies of the second die set (B). The test system sends the necessary Vcc power and GND through the probe pins 49a', 49b' to the look-ahead contacts 44a', 44b, which are routed through the RDL traces 46' into the contacts 48a', 48b' of dies of the third die set (C) (not currently under probe). Upon receiving the Vcc and GND, a stress sequence can be implemented on the dies of the third die set (C).

Upon completion of the testing of the dies in the second die set (B) (currently under probe) and the "remote" stressing of the dies in the third die set (C) (not currently under probe), Step 58 is repeated and the probe head 18' is moved to the next die set (i.e., from the second die set (B) to the third die set (C)), where the probe pins 22' are brought into contact with the pads 30' of the dies of the third die set (C), and the look-ahead contacts 44a', 44b' associated with the third die set (C). Stress/Test Step 60 is repeated to test the dies in the third die set (C) and stress the dies in the fourth die set (D) via the Vcc power and GND furnished to the look-ahead contacts 44a', 44b' of the third die set (C). The Stress and Test Operations can be performed substantially simultaneously to minimize the total time of the two operations.

Steps 58 and 60 are repeated until the remaining die sets (i.e., the fourth die set (D) in the illustrated example) are tested. Thus, in repeating Step 58, probe card 18' is moved to the next probe head position, and then Step 60 is repeated to test the dies (e.g., memory devices) of the die set under probe and to stress the dies remotely connected to the associated look-ahead contacts of the die set currently under probe.

Another embodiment of a probe test protocol according to the invention is illustrated in FIG. 12 in which a probe card can be stepped across a semiconductor substrate (e.g., wafer). While the tester is at a given position on the wafer, stressing can be performed on dies that are positioned on the wafer at future probe head positions. As illustrated, the probe head is sequentially stepped across the wafer starting at Position 1 and proceeding through Positions 2–16.

In the illustrated example, the dies on the wafer comprise BISS circuitry. With the probe head in "Position 1" on the wafer, Step 1 can involve conducting a BISS stress on the dies under probe. With the probe head remaining in Position 1 on the wafer, Step 2 involves a typical probe test and repair flow of the dies under probe. Simultaneously, a BISS stress can be conducted on the dies in Position 2 on the wafer by the routing of the required power, ground and signals from the probe through the look-ahead contacts (associated with the die set at Position 1) to the dies in Position 2.

The probe head is then moved to "Position 2" on the wafer, and Step 3 involves conducting a probe test and repair flow of the dies currently under probe, while conducting a BISS stress of the dies in Position 3 on the wafer by routing required power, ground and signals via the look-ahead contacts (associated with the dies under probe in Position 2) to the dies in Position 3.

The probe head is then moved to "Position 3" on the wafer, and Step 4 is conducted involving a probe test and repair flow of the dies under probe in Position 3. Simultaneously, a BISS stress of the dies in Position 4 on the wafer can be conducted by the routing of required power, ground, and signals via look-head contacts (associated with the die under probe in Position 3) to the dies in Position 4.

The probe head is moved on to "Position 4" on the wafer, and continues through to Position 16, conducting a test and repair flow of the dies under probe, and simultaneous stressing of the dies connected to the look-ahead contacts associated with the dies currently under probe.

The stress operation on the dies is essentially "free" to the manufacture using the method of the invention, in that the stress operation can be conducted during the testing protocol and require no additional time in the testing protocol for it to be implemented. Furthermore, the use of the invention assures higher yields per wafer by exposing the dies to an increased amount of stress prior to being subjected to the probe test and repair flow.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A test system, comprising: a test circuit, and a probe device structured with a first probe element for contact with a contact pad on a first die situated on a substrate and a second probe element for contact with a look-ahead contact situated on the substrate proximal to the first die and electrically connected to a second die situated on the substrate remote from the probe device.

2. A test system, comprising: a test circuit, and a probe device structured with a first probe element for contact with a contact pad on a first die situated on a substrate, and a second probe element for contact with a look-ahead contact situated on but not electrically connected to the first die and electrically connected to a second die remote from the probe device.

3. A test system, comprising: a test circuit, and a probe device structured with a first probe element and a plurality of second probe elements connected to the test circuit, the first probe element configured on the probe device for contact with a contact pad on a die situated on a substrate, and the second probe elements configured on the probe device for contact with look-ahead contacts situated proximal to but not electrically connected to the first die and electrically connected to one or more second dies remote from the first die.

4. A test system, comprising: a test circuit, and a probe device structured with a first probe element and a plurality of second probe elements connected to the test circuit, the first probe element configured on the probe device for contact with a contact pad on a die situated on a substrate, the second probe elements configured on the probe device for contact with look-ahead contacts situated proximal but not electrically connected to the first die and electrically connected to one or more second dies remote from the first die, the second probe elements comprising elements operable to conduct a power supply voltage and a ground potential.

5. A test system, comprising: a test circuit, and a probe device structured with a first probe element configured on the probe device for contact with a contact pad on a first die situated on a substrate and a plurality of second probe elements configured on the probe device for contact with look-ahead contacts situated proximal but not electrically connected to the first die and electrically connected to one or more second dies remote from the first die, the second probe elements comprising elements operable to conduct a power supply voltage, a ground potential, and a signal.

6. A test system, comprising:
circuitry configured to generate signals; and
a probe card comprising probe elements connected to the circuitry, a first probe element configured on the probe card for contact with a contact pad on a first die situated on a wafer, and a second probe element configured on the probe card for contact with a look-ahead contact situated proximal to the first die and electrically connected to a second die remote from the first die.

7. The test system of claim 6, further comprising a wafer handler operable to align the first die with the probe card.

8. A test system, comprising:
circuitry configured to generate signals; and
a probe card comprising probe elements connected to the circuitry, a first probe element situated on the probe card to make contact with a contact pad of a first die situated on a wafer and route a signal to circuitry of the first die, and a second probe element situated on the probe card to make contact with a look-ahead contact situated proximal to the first die and route a signal to the look-ahead contact and a second die electrically connected to the look-ahead contact and remote from the first die.

9. A test system, comprising:
circuitry configured to generate signals; and
a probe card comprising probe elements connected to the circuitry, a first probe element situated on the probe card to make contact with a contact pad of a first die situated on a wafer and route a signal to circuitry of the first die, and a second probe element situated on the probe card to make contact with a look-ahead contact situated proximal to the first die and route a signal to the look-ahead contact, such that, upon generation of signals through the probe elements, an about concurrent operation can be performed on the first die and a second die interconnected to the look-ahead contact and not directly probed by the probe card.

10. A test system, comprising:
circuitry configured to generate signals; and
a probe card comprising probe elements connected to the circuitry, a first probe element situated on the probe card to make contact with a contact pad of a first die situated on a wafer and route a signal to circuitry of the first die, and a second probe element situated on the probe card to make contact with a look-ahead contact situated proximal to the first die and route a signal to the look-ahead contact, such that, upon generation of signals through the probe elements, an about concurrent operation can be performed to test or stress the first die and a second die interconnected to the look-ahead contact and not directly probed by the probe card.

11. A test system, comprising:
circuitry configured to generate signals; and
a probe card structured with a first probe element for contact with a contact pad on a die situated on a wafer, and a second probe element for contact with a look-ahead contact situated proximal to but not electrically connected to the first die and electrically connected to one or more second dies remote from the first die.

12. A test system, comprising:
circuitry configured to generate signals;
a probe card structured with a first probe element for contact with a contact pad on a die situated on a wafer, and a second probe element for contact with a look-ahead contact situated proximal to but not electrically connected to the first die and electrically connected to one or more second dies remote from the first die; and
a probe interface board electrically connecting the circuitry and the probe card.

13. A system for examining dies on a wafer, comprising:
circuitry configured to generate signals;
a probe card connected to the circuitry and comprising probe elements, a first probe element configured for contact with and transmittal of signals to a contact pad situated on a first die, and a second probe element configured for contact with and transmittal of signals to a look-ahead contact situated proximal to the first die and electrically connected to a second die but not to the first die; and
a wafer handler operable to move the wafer to align the dies with the probe card.

14. A system for examining dies on a wafer, comprising:
circuitry configured to generate signals;
a probe card connected to the circuitry and comprising probe elements, a first probe element positioned on the probe card for contact with a contact pad situated on a first die, and a second probe element positioned on the probe card for contact with a look-ahead contact situated proximal to the first die and electrically connected to a second die not under the probe card; and
a wafer handler operable to move the wafer and position the first die in contact with the probe card.

15. The system of claim 14, wherein the wafer handler is operable to move the wafer to position the second die in contact with the probe card.

16. The system of claim 14, wherein the wafer handler is operable to move the wafer to position the second die in contact with the probe card such that the first probe element of the probe card is positioned for contact with a contact pad on the second die and the second probe element is positioned for contact with a second look-ahead contact situated proximal to the second die and electrically connected to a third die not under the probe card.

* * * * *